United States Patent
Matsuyama et al.

(10) Patent No.: US 10,874,041 B2
(45) Date of Patent: Dec. 22, 2020

(54) FEEDER DEVICE AND COMPONENT MOUNTING MACHINE

(71) Applicant: FUJI CORPORATION, Chiryu (JP)

(72) Inventors: Kazuya Matsuyama, Chiryu (JP); Yoshiyuki Fukaya, Chiryu (JP); Hisato Sawanami, Kariya (JP)

(73) Assignee: FUJI CORPORATION, Chiryu (JP)

( * ) Notice: Subject to any disclaimer, the term of this patent is extended or adjusted under 35 U.S.C. 154(b) by 270 days.

(21) Appl. No.: 15/775,427

(22) PCT Filed: Nov. 27, 2015

(86) PCT No.: PCT/JP2015/083422
§ 371 (c)(1),
(2) Date: May 11, 2018

(87) PCT Pub. No.: WO2017/090192
PCT Pub. Date: Jun. 1, 2017

(65) Prior Publication Data
US 2018/0332749 A1    Nov. 15, 2018

(51) Int. Cl.
H05K 13/08   (2006.01)
H05K 13/02   (2006.01)
H05K 13/04   (2006.01)

(52) U.S. Cl.
CPC ......... *H05K 13/0885* (2018.08); *H05K 13/02* (2013.01); *H05K 13/021* (2013.01); *H05K 13/0452* (2013.01)

(58) Field of Classification Search
CPC ............ G05D 3/12; G05D 9/00; G05D 17/00; H05K 13/04; H05K 13/0417; H05K 13/02;

(Continued)

(56) References Cited

U.S. PATENT DOCUMENTS 6,701,611 B1 * 3/2004 Izumida ............. H05K 13/0885
                                                  29/832
8,344,558 B2 * 1/2013 Nishimoto ......... H05K 13/0885
                                                  307/140

(Continued)

FOREIGN PATENT DOCUMENTS

JP        3841585 B2   11/2006
JP     2007-48891 A    2/2007

(Continued)

OTHER PUBLICATIONS

International Search Report dated Mar. 1, 2016 in PCT/JP2015/083422 filed Nov. 27, 2015.

*Primary Examiner* — Carl J Arbes
(74) *Attorney, Agent, or Firm* — Oblon, McClelland, Maier & Neustadt, L.L.P.

(57) ABSTRACT

A power supply control device that controls consumption currents that are supplied from power supply devices in a component supply device in which multiple tape feeders are replaceably installed, the device including: a total consumption current measuring section that obtains, based on measurement, a total consumption current by adding actual consumption currents which are supplied to a plurality of tape feeders; and an overcurrent protection section that causes a specific tape feeder, which is in an operation state, to transition to a stop state or a standby state, in a case of an overcurrent state where the total consumption current exceeds an output current capacity of the power supply device. Accordingly, even though the overcurrent state occurs during setup changing work in which the multiple tape feeders can operate, the overcurrent state is rapidly canceled, and thus a protecting function is improved.

11 Claims, 10 Drawing Sheets

(58) Field of Classification Search
CPC ............ H05K 13/021; H05K 13/0452; H05K 13/0885
See application file for complete search history.

(56) References Cited

U.S. PATENT DOCUMENTS

| | | | |
|---|---|---|---|
| 8,788,106 B2* | 7/2014 | Stothers | H02J 3/14 |
| | | | 700/286 |
| 2003/0233201 A1* | 12/2003 | Horst | H02J 13/0086 |
| | | | 700/295 |
| 2004/0143964 A1 | 7/2004 | Izumida et al. | |
| 2005/0187727 A1* | 8/2005 | Weik | H02J 3/14 |
| | | | 700/291 |
| 2007/0270992 A1* | 11/2007 | Nishida | H05K 13/0885 |
| | | | 700/111 |
| 2007/0293969 A1* | 12/2007 | Hirai | H05K 13/0885 |
| | | | 700/114 |
| 2008/0148076 A1* | 6/2008 | Gabor | G06F 1/3203 |
| | | | 713/300 |
| 2009/0164812 A1* | 6/2009 | Capps, Jr. | G06F 1/3203 |
| | | | 713/320 |
| 2009/0193424 A1* | 7/2009 | Shen | G06F 9/3867 |
| | | | 718/103 |
| 2012/0102343 A1 | 4/2012 | Kondo et al. | |
| 2012/0317798 A1* | 12/2012 | Kitagawa | H05K 13/0411 |
| | | | 29/739 |

FOREIGN PATENT DOCUMENTS

| | | |
|---|---|---|
| JP | 2007-207976 A | 8/2007 |
| JP | 2008-244162 A | 10/2008 |
| JP | 2009-111113 A | 5/2009 |
| WO | WO 2011/121934 A1 | 10/2011 |

* cited by examiner

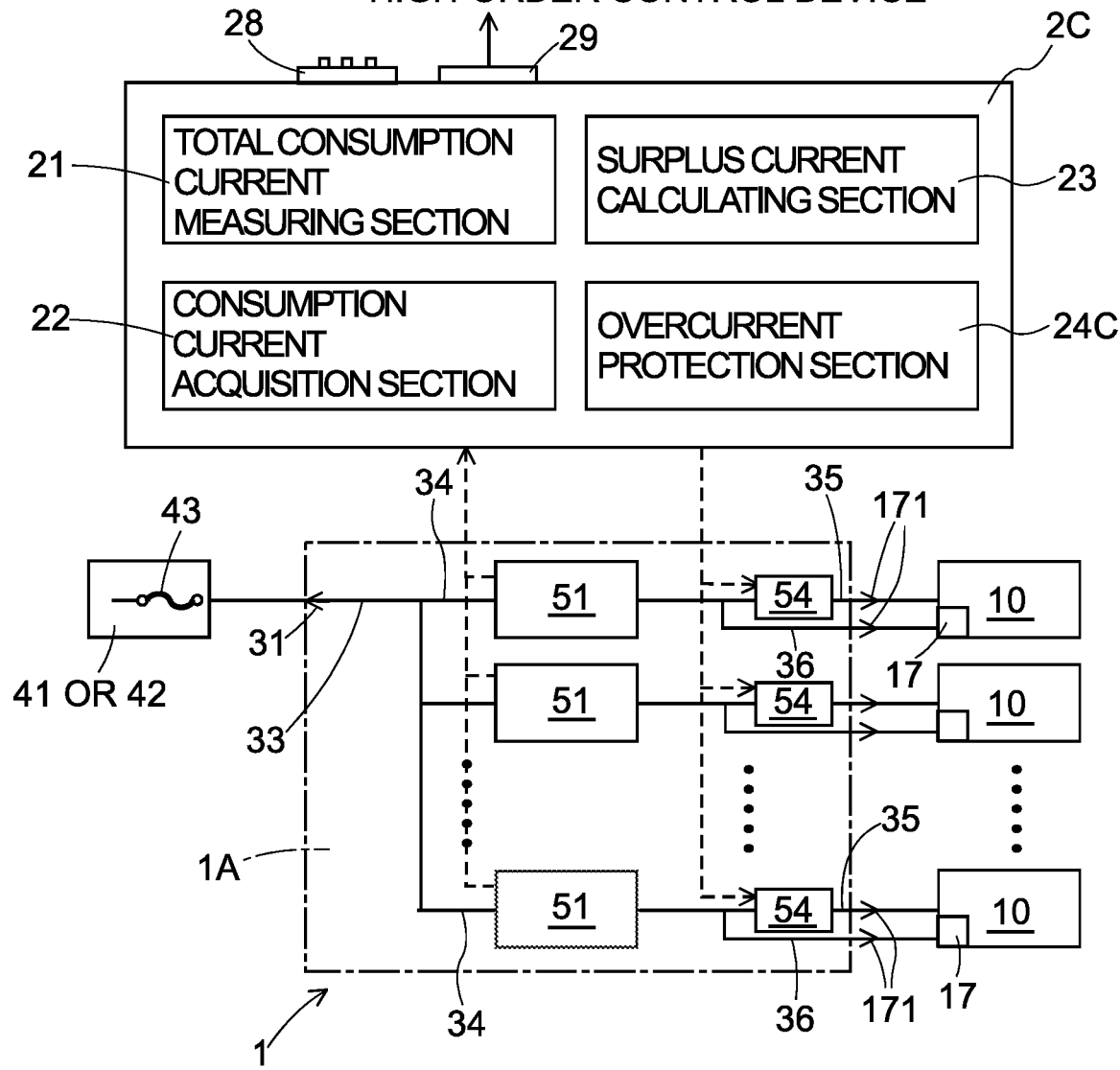

FEEDER DEVICE AND COMPONENT MOUNTING MACHINE

TECHNICAL FIELD

The present application relates to a power supply control device that controls a consumption current, which is supplied from a power supply device to installed tape feeders, and a power supply control method of a component supply device in which multiple the tape feeders are installed in a replaceable manner.

BACKGROUND ART

A solder printing machine, an electronic component mounting machine, a reflow machine, a board inspection machine, and the like are used as pieces of equipment that perform production work of a board. In general, such pieces of equipment are linked to each other and configure a board production line. The electronic component mounting machine includes a board conveyance device, a component supply device, and a component transfer device on a device table. A representative configurational example of the component supply device includes a widely used configuration in which multiple tape feeders that unwind a carrier tape and are detachably arranged on the device table. When the component supply device is mounted on the device table, the component supply device is connected to an internal-operating power supply device, and a consumption current is supplied to the tape feeders.

There is a significant difference between an operation state consumption current consumed when a feeding motor of the tape feeder operates so as to unwind the carrier tape and a standby state consumption current consumed when the feeding motor does not operate. In addition, the operation state consumption current and the standby state consumption current vary depending on types of tape feeders. Here, when the electronic component mounting machine produces a board, there is no situation where multiple tape feeders simultaneously operate. Therefore, an output current capacity of the internal-operating power supply device is appropriately set in consideration of a case where about several tape feeders simultaneously operate. On the other hand, an external-setup-changing power supply device is prepared for performing setup changing work in a state where the component supply device is detached from the device table, in some cases. PTL 1 discloses a technical example in terms of power supply of this type of component supply device.

An electronic component mounting machine in PTL 1 includes a mounting machine main body section provided with multiple built-in power supplies and a component supply device on which an actuator (feeding motor) is mounted. Further, the electronic component mounting machine includes connection means for storing identification information of the actuator, control means for selecting any built-in power supply based on the identification information, and power supply switching means for switching a power supply path such that it is possible to supply power from the selected built-in power supply to the component supply device. Accordingly, a simple configuration of including the connection means for storing the identification information of the actuator enables any built-in power supply to be selected and enables manufacturing costs to be reduced. To put it briefly, an inner power supply having the optimal output current capacity is selected depending on intensity of consumption current of the actuator, and a capacity of a cable or a connector is suppressed to be low. In this manner, it is possible to reduce manufacturing costs.

CITATION LIST

Patent Literature

PTL 1: JP-A-2007-207976

BRIEF SUMMARY

Technical Problem

Incidentally, in PTL 1, multiple built-in power supplies are a factor of an increase in costs, and a single internal-operating power supply device is advantageous in respect of costs. However, a problem arises in terms of the output current capacity, recently in the internal-operating power supply device corresponding to operations of about several tape feeders.

More specifically, during setup changing work of changing a component type that is supplied from a tape feeder, the feeding motor is reversely driven so as to perform an unloading operation of discharging a loaded carrier tape from the tape feeder. With a type of tape feeder in the related art, it is necessary to keep pressing a button for performing the unloading operation, and unloading operations are generally performed in two or fewer feeders. By comparison, in a new model of auto loading feeder, once an operation button is pushed, the unloading operation is performed to the end. Therefore, it is possible to perform the unloading operations in multiple feeders. In this case, there is a concern that higher consumption current will flow than during board production, and overcurrent exceeding the output current capacity of the internal-operating power supply device will occur.

The problem described above can similarly occur in external setup changing work using an external-setup-changing power supply device, as well. Rather, in a case of changing component types for all of arranged tape feeders, the external setup changing work is generally performed, and thus there is a high risk of overcurrent.

The present disclosure is made in consideration of the problem in background art, and an object to be achieved is to provide a power supply control device and a power supply control method of a component supply device in which a function of protecting against overcurrent that is likely to occur during setup changing work is improved.

Solution to Problem

A power supply control device according to the present disclosure that solves the problem is a power supply control device of a component supply device in which a plurality of tape feeders each including a driving device which supplies a taped electronic component to a predetermined position and a control device that controls the driving device are replaceably installed, the power supply control device controlling a consumption current that is supplied from a power supply device to the installed tape feeders. The power supply control device includes: a total consumption current measuring section that obtains, based on measurement, a total consumption current by adding actual consumption currents which are supplied to the plurality of tape feeders installed in the component supply device; and an overcurrent protection section that causes a specific tape feeder of the plurality of tape feeders, which is in an operation state where the driving device operates, to transition to a stop state where the specific tape feeder is shut from the power supply device or a standby state where the operation of the driving device is stopped, in a case of an overcurrent state where the total consumption current exceeds an output current capacity of the power supply device.

A power supply control method of a component supply device according to the present disclosure is a power supply control method of a component supply device in which a plurality of tape feeders each including a driving device which supplies a taped electronic component to a predetermined position and a control device that controls the driving device are replaceably installed, the power supply control method controlling a consumption current that is supplied from a power supply device to the installed tape feeders. The power supply control method includes: a total consumption current measuring step of obtaining, based on measurement, a total consumption current by adding actual consumption currents which are supplied to the plurality of tape feeders installed in the component supply device; and an overcurrent protection step of causing a specific tape feeder of the plurality of tape feeders, which is in an operation state where the driving device operates, to transition to a stop state where the specific tape feeder is shut from the power supply device or a standby state where the operation of the driving device is stopped, in a case of an overcurrent state where the total consumption current exceeds an output current capacity of the power supply device.

Advantageous Effects

The power supply control device of the component supply device of the present disclosure causes the specific tape feeder that is in the operation state to transition to the stop state or the standby state, in the case of the overcurrent state where the total consumption current obtained based on the measurement exceeds the output current capacity of the power supply device. Therefore, the total consumption current is reduced. Hence, even though the overcurrent state occurs during setup changing work in which multiple tape feeders can operate, the overcurrent state is rapidly canceled, and thus a protecting function is improved.

In addition, the present disclosure can be embodied as the power supply control method of the component supply device, and the same effects as those of the power supply control device of the component supply device of the present disclosure described above are obtained.

BRIEF DESCRIPTION OF DRAWINGS

FIG. 10 is a block diagram illustrating a power supply control device of the component supply device of a fourth embodiment.

DESCRIPTION OF EMBODIMENTS (1. Entire Configuration of Electronic Component Mounting Machine 9)

Figure 1:
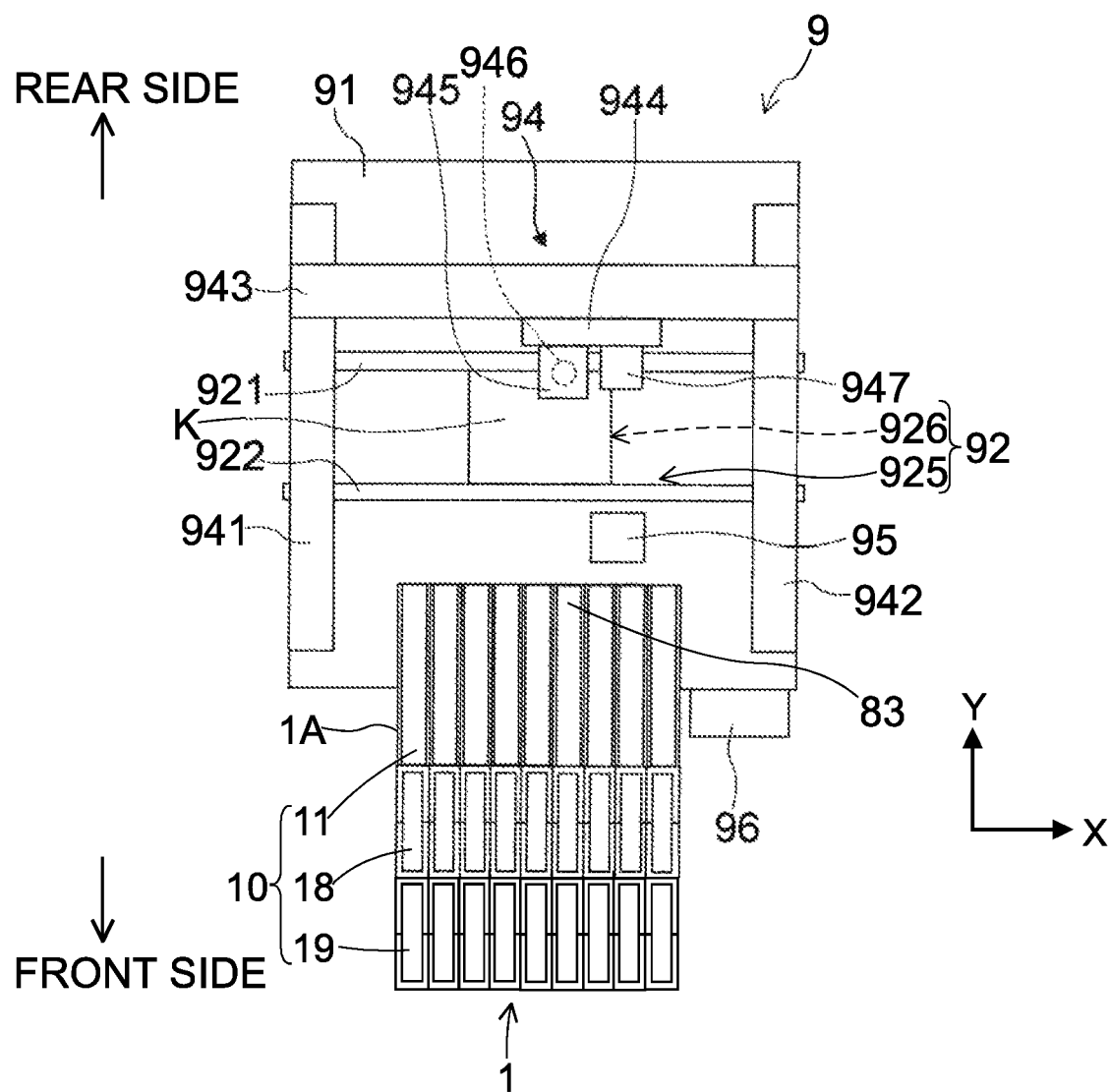
FIG. 1 is a plan view illustrating an entire configuration of an electronic component mounting machine using a power supply control device of a component supply device of a first embodiment of the present disclosure.

A power supply control device 2 of a component supply device 1 of a first embodiment of the present disclosure is described with reference to FIGS. 1 to 5. First, an entire configuration of an electronic component mounting machine 9 using the power supply control device 2 of the component supply device 1 of the first embodiment of the present disclosure is described. FIG. 1 is a plan view schematically illustrating the entire configuration of the electronic component mounting machine 9. A direction from the right side to the left side on the paper surface of FIG. 1 is referred to as an X-axis direction in which a board K is loaded and unloaded, and a direction from the front side on the lower side on the paper surface to the rear side on the upper side on the paper surface is referred to as a Y-axis direction. The electronic component mounting machine 9 is configured of an assembly of a board conveyance device 92, a component supply device 1, a component transfer device 94, a component camera 95, a control device 96, and the like on a device table 91. The board conveyance device 92, the component supply device 1, the component transfer device 94, and the component camera 95 are controlled by the control device 96, and each of the devices is configured to perform predetermined work.

The board conveyance device 92 loads, positions, and unloads the board K to, at, and from a mounting position. The board conveyance device 92 includes a conveyance unit 925 and a backup unit 926. The conveyance unit 925 is configured of a pair of guide rails 921 and 922, a pair of conveyor belts, and the like. The pair of guide rails 921 and 922 is assembled on the device table 91 in a parallel manner by crossing over the center of an upper face of the device table 91. The pair of conveyor belts disposed on an inner aide on which the pair of guide rails 921 and 922 faces each other rotates in a state where both edges of the board K are placed on respective belts and loads and unloads the board K to and from the mounting position set at a central portion of the device table 91. The backup unit 926 is disposed below the mounting position and pushes up and clamps the board K with a horizontal posture.

The component supply device 1 is configured of multiple tape feeders 10 arranged on a substantially rectangular pallet member 1A that is attached to and detached from the upper face of the device table 91. Various type or sizes of tape feeders 10 are used, and the consumption current varies depending on the type or size. Here, a type of tape feeder 10 called an auto loading feeder is assumed to be used. The tape feeder 10 is configured of a main body section 11 and two supply reels 18 and 19 disposed on a posterior portion of the main body section 11. The supply reels 18 and 19 wind and hold a carrier tape on which multiple electronic components are taped in a row. The carrier tape is unwound by predetermined pitches, and the electronic components are released from an accommodating state and are sequentially supplied.

Figure 2:
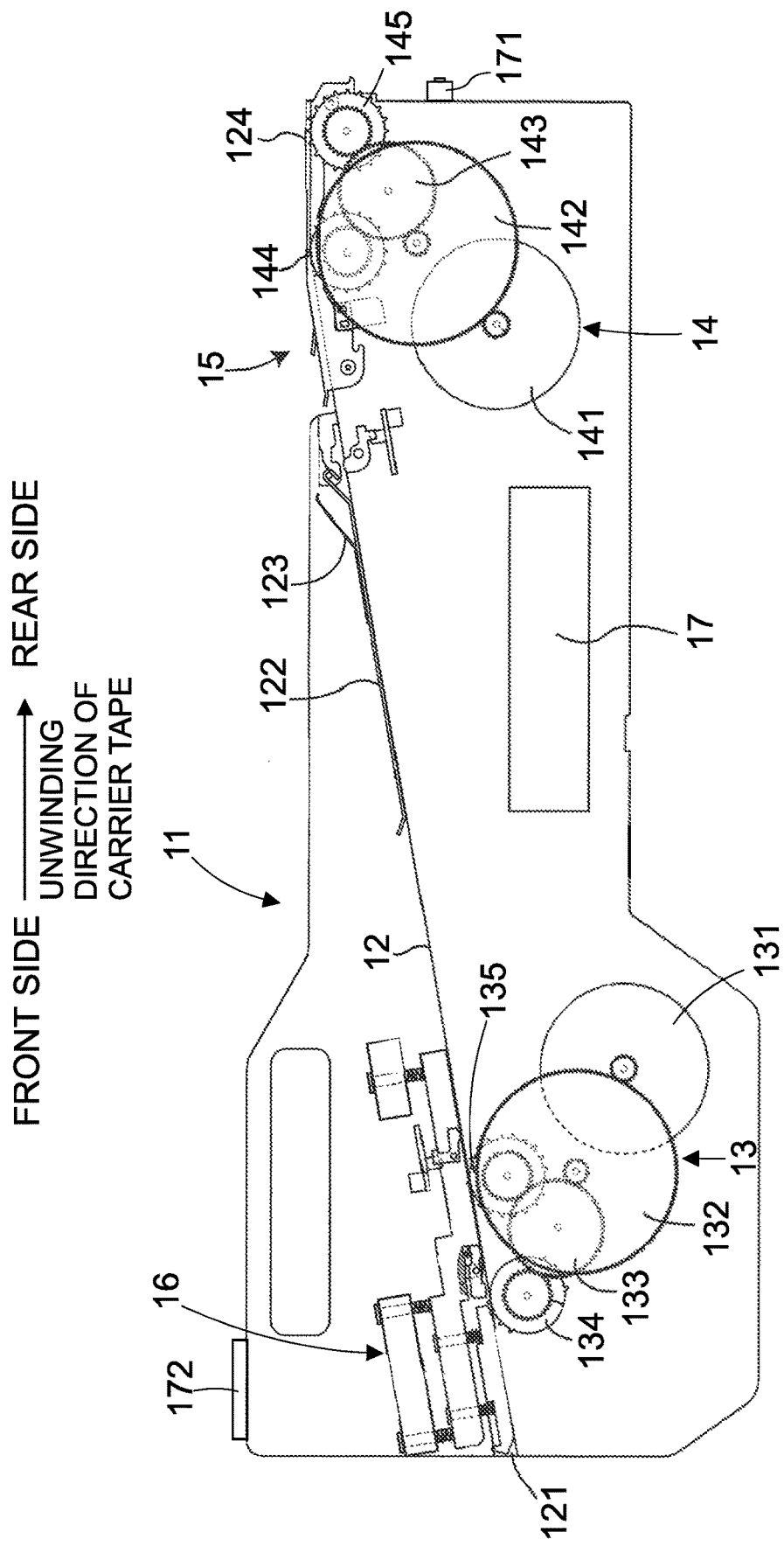
FIG. 2 is a side sectional view schematically illustrating an internal configuration of a main body section of a tape feeder.

FIG. 2 is a side sectional view illustrating an internal configuration of the main body section 11 of the tape feeder 10. The tape feeder 10 is configured of an assembly of rails 12 on two side plates which form the main body section 11, a front tape feeding mechanism 13, a rear tape feeding mechanism 14, a tape peeling mechanism 15, a following-tape control mechanism 16, a control device 17, and the like. The two side plates which form the main body section 11 are disposed to be separated in parallel with each other, and the front side plate on the paper surface is omitted in FIG. 2.

The rail 12 is a member that guides unwinding of the carrier tape on an upper face of the rail. The rail 12 is disposed to be inclined from an approximately middle height on the front side of the main body section 11 to an upper portion on the rear side. An insertion port 121 formed on the upper side of a front end of the rail 12 is formed to enable vertically overlapped carrier tapes unwound from the two supply reels 18 and 19 to be inserted into the opening. A lifting prevention member 122 is provided on the vicinity of an intermediate portion of the rail 12 in a length direction. The lifting prevention member 122 is pressed against the upper face of the rail 12 by a torsion spring 123. The lifting prevention member 122 prevents the carrier tape from floating by pinching the carrier tape in cooperation with the rail 12 in an unwindable manner. A component supply position 124 is set on an upper side in the vicinity of a rear end of the rail 12.

The front tape feeding mechanism 13 is disposed in a lower portion close to the front side of the rail 12. The front tape feeding mechanism 13 is configured of a first feeding motor 131, a first gear 132, a second gear 133, a first sprocket 134, a second sprocket 135, and the like. An output shaft of the first feeding motor 131 is rotatably connected to the first sprocket 134 and the second sprocket 135 via the first gear 132 and the second gear 133 through gear coupling. Output teeth of the first sprocket 134 and the second sprocket 135 project upward from a gap formed between the rails 2 and engage with engagement holes of the carrier tape.

The rear tape feeding mechanism 14 is disposed in a lower portion close to the rear side of the rail 12. The rear tape feeding mechanism 14 is configured of a second feeding motor 141, a third gear 142, a fourth gear 143, a third sprocket 144, a fourth sprocket 145, and the like. An output shaft of the second feeding motor 41 is rotatably connected to the third sprocket 144 and the fourth sprocket 145 via the third gear 142 and the fourth gear 143 through gear coupling. Output teeth of the third sprocket 144 and the fourth sprocket 145 project upward from the gap formed between the rails 12 and engage with engagement holes of the carrier tape. The first feeding motor 131 and the second feeding motor 141 correspond to a driving device of the present disclosure which supplies a taped electronic component to a predetermined position.

The tape peeling mechanism 15 is disposed in an upper portion close to the rear side of the rail 12, that is, above the rear tape feeding mechanism 14. The tape peeling mechanism 15 peels off a cover tape of the unwinding carrier tape from the carrier tape and is capable of supplying a component to the component supply position 124.

The following-tape control mechanism 16 is disposed in an upper portion close to the front side of the rail 12, that is, above the front tape feeding mechanism 13. The following-tape control mechanism 16 controls unwinding of first and second carrier tapes which overlap each other and are inserted into the insertion port 121 from the two supply reels 18 and 19. In other words, the following-tape control mechanism 16 allows the currently used first carrier tape to be unwound and holds a portion in the vicinity of a front end of the second carrier tape to be used next. When the first carrier tape ends, the following-tape control mechanism 16 automatically starts unwinding the second carrier tape and allows a third carrier tape to be inserted.

The control device 17 is disposed at a position close to the lower side of the main body section 12. The control device 17 includes a microprocessor, a memory, a driver, a communication section, or the like and is operated by software. When the tape feeder 10 is installed on the pallet member 1A, the control device 17 and the control device 96 are connected to communicate with each other via a connector 171 provided on a rear face of the main body section 11. In this manner, the control device 17 is capable of transmitting and receiving necessary information to and from the control device 96. The connector 171 has a function of supplying power to the tape feeder 10. The control device 17 controls the driving device, that is, controls the first feeding motor 131 and the second feeding motor 141.

When the carrier tapes of new supply reels 18 and 19 are used, an operator pulls out front ends of the carrier tapes of the supply reels 18 and 19 and inserts the front ends thereof to the first sprocket 134 from the tape insertion port 121. Under the control performed by the control device 17, the first feeding motor 131 and the second feeding motor 141 rotate forward and the carrier tapes are loaded. Such an operation of the tape feeder 10 is a loading operation. In addition, under the control performed by the control device 17, the first feeding motor 131 and the second feeding motor 141 are intermittently driven, the carrier tapes are fed by pitches loaded, and thereby a component is supplied. Such an operation of the tape feeder 10 is a component supply operation.

Further, in an unloading operation of the tape feeder 10, the first feeding motor 131 and the second feeding motor 141 are reversely driven under the control performed by the control device 17. The first to fourth sprockets 134, 135, 144, and 145 reversely rotate, and the carrier tapes return to the front side. Finally, the carrier tapes are discharged to the front side of the first sprocket 134. In this manner, the operator can replace the supply reels 18 and 19 after use with new supply reels 18 and 19. The unloading operation is an operation of collecting the carrier tapes after use and is often performed during setup changing work that is entailed after a change in type of board K to be produced. At this time, the unloading operations are simultaneously performed on the multiple tape feeders 10, an overcurrent state of the power supply device 41 or 42 (refer to FIG. 3) is likely to occur.

An operation panel 172 is disposed in an upper front portion of the main body section 11. The operation panel 172 transmits and receives information by connecting to the control device 17. The operation panel 172 includes an operation section that receives an operation performed by an operator and a display section that supplies information to the operator.

Back to FIG. 1, the component transfer device 94 suctions and picks up electronic components from the component supply position 124 of multiple tape feeders 10 and conveys to and mounts on the positioned board K. The component transfer device 94 a XY-robot type device that is horizontally movable in the X-axis direction and the Y-axis direction. The component transfer device 94 is configured of a pair of Y-axis rails 941 and 942, a Y-axis slider 943, a mounting head 944, a nozzle tool 945, a suction nozzle 946, a board camera 947, and the like. The pair of Y-axis rails 941 and 942 is disposed at positions close to the side faces of the device table 91 on both sides and extends in a front-rear direction (Y-axis direction). The Y-axis slider 943 is mounted over the Y-axis rails 941 and 942 to be movable in the Y-axis direction.

The mounting head 944 is mounted over the Y-axis slider 943 and is movable in the X-axis direction. The mounting head 944 is driven in the X-axis direction and the Y-axis direction by two sets of bail screw mechanisms. The nozzle tool 945 is held by the mounting head 944 in a replaceable manner. The nozzle tool 945 has one or multiple suction nozzles 946 that suctions the component and mounts the component on the board K. The board camera 947 is provided along with the nozzle tool 945 on the mounting head 944. The board camera 947 images a fiducial mark attached on the board K and detects an accurate position of the board K.

The component camera 95 is provided to face up on the upper face of the device table 91 between the board conveyance device 92 and the component supply device 1. The component camera 95 images a state of the electronic component that is suctioned by the suction nozzle 946 while the mounting head 944 moves from the component supply device 1 to the board K. When an error of a suction posture, a deviation in a rotation angle of the electronic component, or the like is found from captured image data of the component camera 95, the control device 96 performs fine adjustment on the component mounting operation as necessary.

The control device 96 stores a type and order of electronic components that are mounted on the board K and a mounting sequence of designating the tape feeders 10 that supply the electronic components. The control device 96 controls the component mounting operation in accordance with the mounting sequence, based on the captured image data from the board camera 947 and the component camera 95 and detection data from a sensor (not illustrated). In addition, the control device 96 sequentially collects and updates operation condition data such as the number of produced boards K, a mounting time taken to mount the electronic component, the number of times of occurrences of suction errors of the electronic components.

(2. Configuration of Power Supply Control Device 2 of Component Supply Device 1 of First Embodiment)

Figure 3:
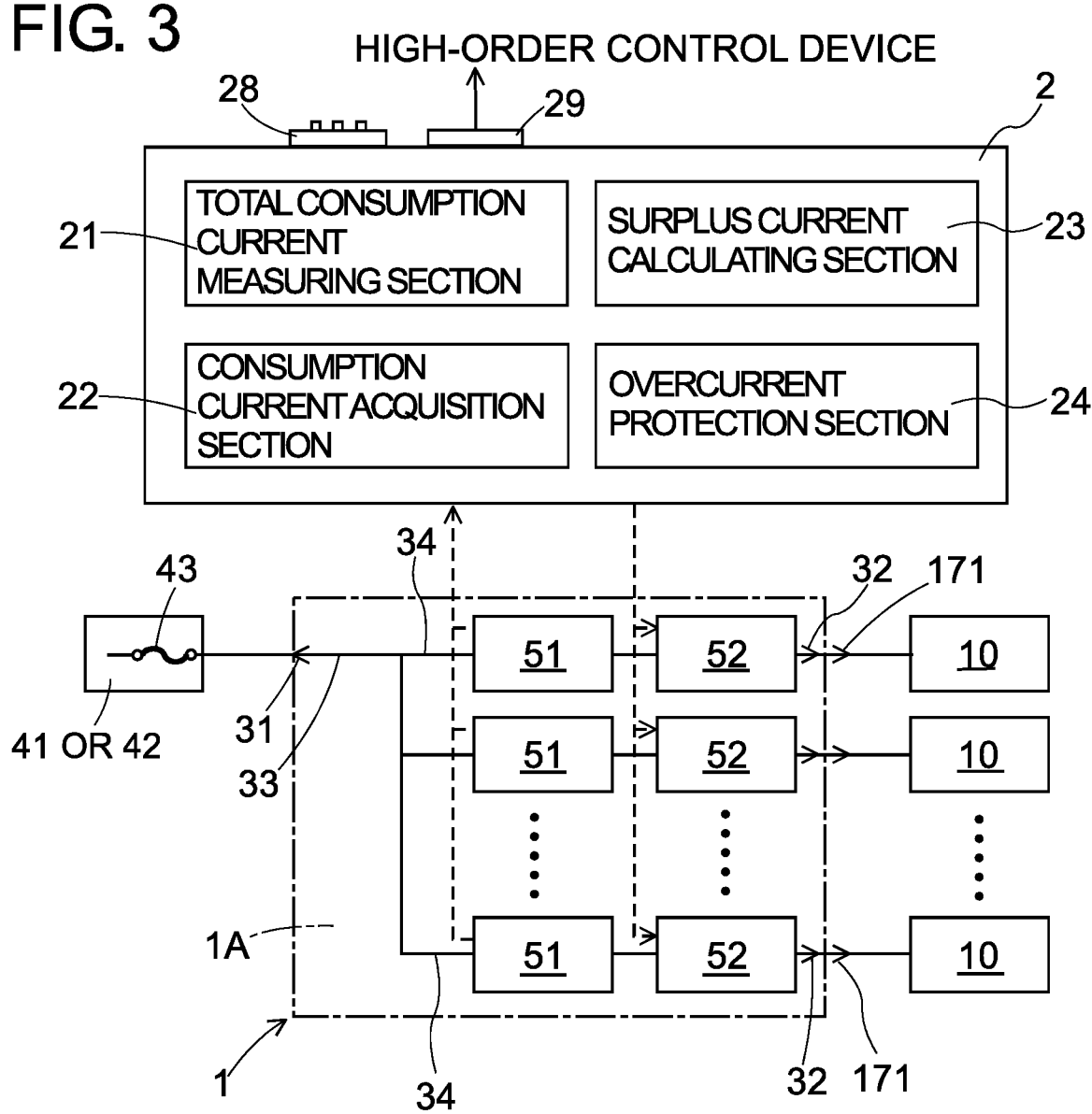
FIG. 3 is a block diagram illustrating the power supply control device of the component supply device of the first embodiment.

The power supply control device 2 of the component supply device 1 of the first embodiment is described. FIG. 3 is a block diagram illustrating the power supply control device 2 of the component supply device 1 of the first embodiment. The power supply control device 2 is configured of four functional sections 21 to 24, the same number of individual-current measurement sections 51 and power switches 52 as the number of tape feeders 10 disposed on the pallet member 1A, and the like. As illustrated in the figure, the pallet member 1A has one power supply-side connector 31, multiple feeder-side connectors 32, a main power supply line 33, and multiple branched power supply lines 34. A main power supply line 33 comes out from the power supply-side connector 31 and branches into multiple branched power supply lines 34 at an intermediate position. The branched power supply lines 34 are connected to the respective feeder-side connectors 32.

When the component supply device 1 is installed in the electronic component mounting machine 9, the main power supply line 33 is automatically connected to an internal-operating power supply device 41 by the power supply-side connector 31. When the component supply device 1 is detached from the electronic component mounting machine 9, an external-setup-changing power supply device 42 can be connected to the power supply-side connector 31. The internal-operating power supply device 41 and the external-setup-changing power supply device 42 have a protective fuse 43 at an output end. An output current capacity Icap of the internal-operating power supply device 41 and the external-setup-changing power supply device 42 is appropriately set to correspond to the operations of the several tape feeders 10. On the other hand, when the tape feeders 10 are installed on the pallet member 1A, the feeder-side connector 32 is connected to the connector 171 of the tape feeder 10, and the branched power supply lines 34 are connected to the tape feeders 10.

Power supply voltage supplied from the power supply device 41 or 42 via the main power supply line 33 and the branched power supply lines 34 is supplied to the first feeding motor 131, the second feeding motor 141, and the control device 17 of the tape feeder 10. In a case where control voltage of the control device 17 is lower than the power supply voltage, a voltage conversion device is provided in the tape feeder 10. The voltage conversion device decreases the power supply voltage to the control voltage and supplies the decreased voltage to the control device 17. Further, the same control voltage as that to the control device 17 is also supplied to sensors (not illustrated).

The individual-current measurement sections 51 and the power switches 52 are provided to the respective branched power supply lines 34. For example, the individual-current measurement sections 51 measures individual consumption currents that flow through the branched power supply lines 34 in accordance with a voltage drop measuring method using a shunt resistor. The power supply control device 2 acquires information of individual measured values obtained by the individual-current measurement sections 51. Under opening and closing control performed by the power supply control device 2, a shut-off state and a conduction state of the power switches 52 are switched.

A tape feeder 10 that is shut off from the power supply device 41 or 42 by the power switch 52 comes into a stop state where the first feeding motor 131, the second feeding motor 141, and the control device 17 are all stopped. A tape feeder 10 to which power is conducted from the power supply device 41 or 42 by the power switch 52 comes into a standby state where the control device 17 operates or an operation state where the first feeding motor 131 and the second feeding motor 141 operate, in addition to the control device 17. The consumption current flowing during the standby state is referred to as a standby state consumption current, and the consumption current flowing during the operation state is referred to as an operation state consumption current.

While the component supply device 1 is installed in the electronic component mounting machine 9, and the beard K is produced, all of the power switches 52 come into the conduction state, and the power supply control device 2 does not function. The power supply control device 2 functions in a case where production of the board K is ended or paused, and internal setup changing work is performed, and a case where external setup changing work is performed by the component supply device 1 detached from the electronic component mounting machine 9.

The power supply control device 2 is a computer device that includes a CPU and operates with software. The power supply control device 2 may be integrally configured with the internal-operating power supply device 41, may be integrally configured with the external-setup-changing power supply device 42, or may be configured as a single body. In addition, the power supply control device integrally provided with the internal-operating power supply device 41 may be separate from the power supply control device integrally provided with the external-setup-changing power supply device 42. As illustrated in FIG. 3, the power supply control device 2 includes a setting operation section 28 or is connected to communicate with a high-order control device such as a control device 96 via a communication section 29.

The power supply control device 2 is connected to the control devices 17 of the tape feeders 10 via a control line (not illustrated) or is connected to communicate with the control device 17 via another control device. In this manner, the power supply control device 2 can find states of the tape feeders 10. For example, the power supply control device 2 can find a state as the stop state of the tape feeder 10 when there is no signal in the control line, the standby state of the tape feeder 10 when a low signal is detected in the control line, and the operation state of the tape feeder 10 when a high signal is detected in the control line.

The power supply control device 2 receives an input operation to the setting operation section 28, an instruction from a high-order control device, and a request of the unloading operation by an input operation to the operation panel 172 of the tape feeder 10. The request of the unloading operation includes both of a collective request to all of the tape feeders 10 as targets and an individual request to a specific tape feeder 10 as a target. Multiple individual requests may be issued simultaneously or continually in a short time.

The power supply control device 2 includes a total consumption current measuring section 21, a consumption current acquisition section 22, a surplus current calculating section 23, and an overcurrent protection section 24 as four functional sections. The functional sections 21 to 24 are realized by software. Detailed functions and operations of the functional sections 21 to 24 are described below.

(3. Operation of Power Supply Control Device 2 of Component Supply Device 1 of First Embodiment)

Figure 4:
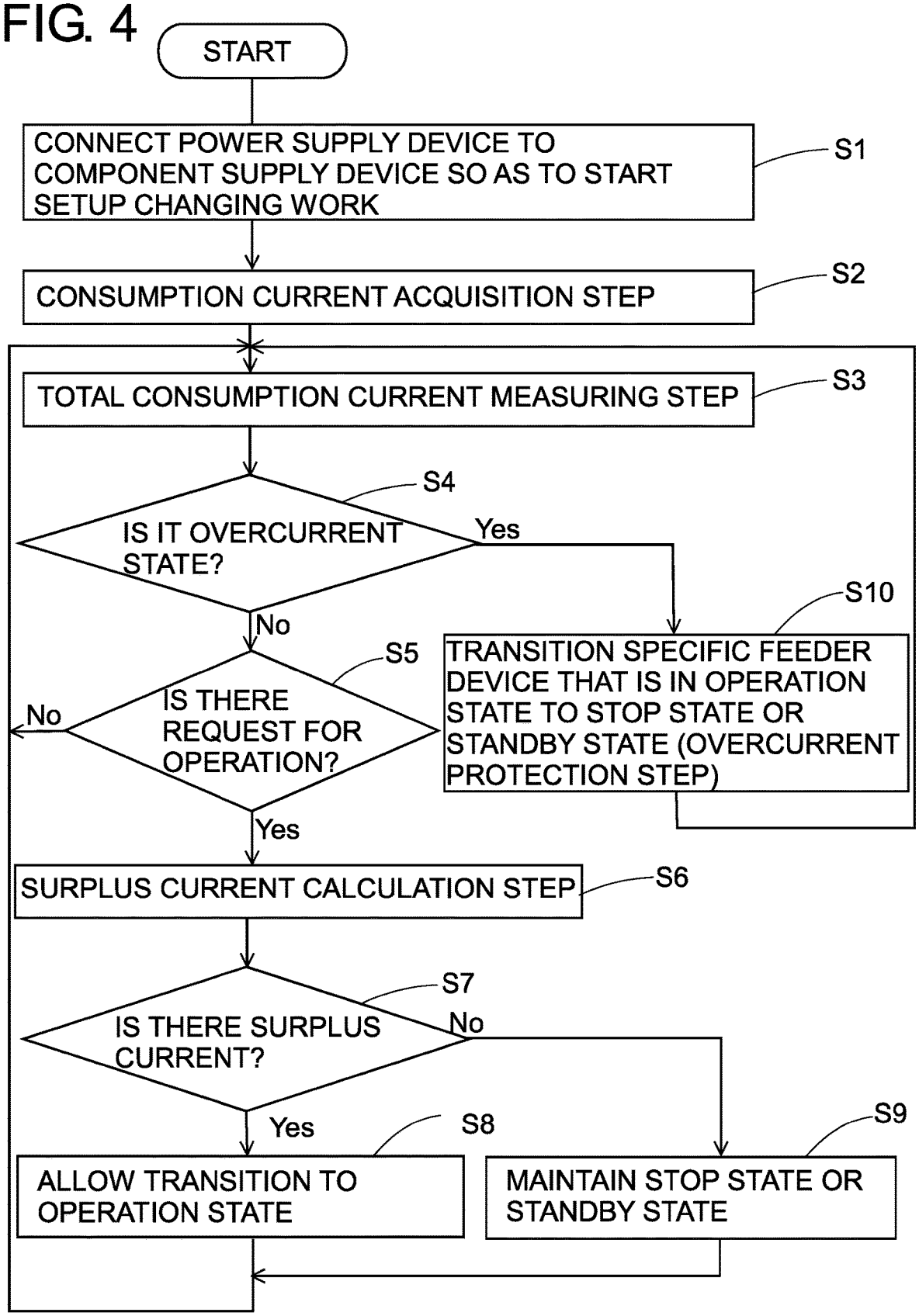
FIG. 4 is a flowchart of operation flow illustrating an operation of the power supply control device of the component supply device of the first embodiment.

Next, an operation of the power supply control device 2 of the component supply device 1 of the first embodiment will be described. FIG. 4 is a flowchart of operation flow illustrating the operation of the power supply control device 2 of the component supply device 1 of the first embodiment. In FIG. 4, a power supply control method of a component supply device 1 of the embodiment of the present disclosure is also described. In step S1 in FIG. 4, the operator connects the power supply device to the component supply device 1 and starts the setup changing work. In other words, the operator starts the internal setup changing work in a state where the component supply device 1 is connected to the internal-operating power supply device 41. Otherwise, the external-setup-changing power supply device 42 is connected to the component supply device 1 outside the machine and the external setup changing work is started. At the time of the start of the setup changing work, all of the tape feeders 10 are in the stop state where the power switches 52 shut off or a standby state where the first feeding motor 131 and the second feeding motor 141 do not operate even when the power switches 52 are conducted.

Next, in a consumption current acquisition step S2, the consumption current acquisition section 22 of the power supply control device 2 operates. The consumption current acquisition section 22 acquires the operation state consumption current and a standby state operation current in advance in all of the tape feeders 10 which are arranged on the pallet member 1A. An acquiring method is not limited and, for example, it is possible to employ a method in which the consumption current acquisition section 22 accesses database, in which current values are stored, through a communication section 29 and the high-order control device. Any one of measured values obtained in advance by the individual-current measurement sections 51, a measured value obtained by another measuring instrument, and a design value may be used as the operation state consumption current and the standby state operation current. The consumption current acquisition section 22 stores the operation state consumption currents of the tape feeders 10 as respective first increments thereof. In addition, the consumption current acquisition section 22 obtains and stores second increments by subtracting the standby state operation currents from the operation state consumption currents of the tape feeders 10.

Next, in a total consumption current measuring step S3, the total consumption current measuring section 21 operates. The total consumption current measuring section 21 receives and acquires information of individual measured values from the individual-current measurement sections 51. Further, the total consumption current measuring section 21 obtains a total consumption current Itot by adding all of the individual measured values.

In the next step S4, the overcurrent protection section 24 operates and determines whether or not the overcurrent state where the total consumption current Itot exceeds the output current capacity Icap of the power supply device 41 or 42 occurs. In step S5 of a case where there is no overcurrent state, the overcurrent protection section 24 determines whether or not a request of the unloading operation is issued to any one of the tape feeders 10. When the request is issued, the overcurrent protection section 24 causes the control of the operation flow to return to the total consumption current measuring step S3. In a surplus current calculation step S6 when the request is issued, the surplus current calculating section 23 operates. The surplus current calculating section 23 calculates a surplus current Irem obtained by subtracting the total consumption current Itot from the output current capacity Icap of the internal-operating power supply device 41 or the external-setup-changing power supply device 42.

Next, in Step S7, the overcurrent protection section 24 determines presence or absence of the surplus current. More specifically, in a case where the tape feeder 10 to which the request of unloading operation is issued is in the stop state, the overcurrent protection section compares the first increment of the corresponding tape feeder 10 with the surplus current Irem. In addition, in a case where the tape feeder 10 to which the request of unloading operation 13 issued is in the standby state, the overcurrent protection section 24 compares the second increment of the corresponding tape feeder 10 with the surplus current Irem. In any case, when the surplus current Irem is lower, the surplus current is determined to be present.

In step S8 when the surplus current is present, the overcurrent protection section 24 causes the tape feeder 10, to which the request is issued, to start the unloading operation and al lows the tape feeder to transition to the operation state. In step S9 when there is no surplus current, the overcurrent protection section 24 shuts off the power switch 52 of the corresponding tape feeder 10 so as to prohibit the tape feeder 10, to which the request is issued, from operating the unloading operation. In this manner, the corresponding tape feeder 10 comes into the stop state. Accordingly, the overcurrent protection section 24 has a first function of preventing the occurrence of the overcurrent state. After Step S8 and Step S9, the overcurrent protection section 24 causes the control of the operation flow to return to the total consumption current measuring step S3.

In addition, in step S10 of a case of the occurrence of the overcurrent state in step S4, the overcurrent protection section 24 causes some specific tape feeders 10 of the tape feeders 10, which are in the operation state, to transition to the stop state or the standby state. Step S10 corresponds to an overcurrent protection step S10 in the power supply control method of the component supply device 1 of the embodiment.

Specifically, when there is a specific tape feeder 10 in which the individual measured values of the consumption currents exceed the obtained operation state consumption current, the overcurrent protection section 24 shuts off the corresponding power switch 52 and causes the specific tape feeder to transition to the stop state. In a case where the measured values of the consumption currents exceed the obtained operation state consumption current, the corresponding tape feeder 10 is estimated to have a fault such as a short-circuit fault. When there is no tape feeder 10 that is estimated to have a fault, the overcurrent protection section 24 determines, in accordance with a preset priority, the tape feeder 10 such that the tape feeder transitions from the operation state to the stop state.

An operation in step S10 normally causes the overcurrent state to be rapidly canceled. In other words, the overcurrent protection section 24 has a second function of rapidly canceling the occurrence of the overcurrent state. After step S10, the overcurrent protection section 24 causes the control of the operation flow to return to the total consumption current measuring step S3. In a case where the overcurrent state is not yet canceled in Step S4 again after returning to step S3, the control proceeds to step S10 again. The overcurrent protection section causes another tape feeder 10 to transition from the operation state to the stop state.

Figure 5:
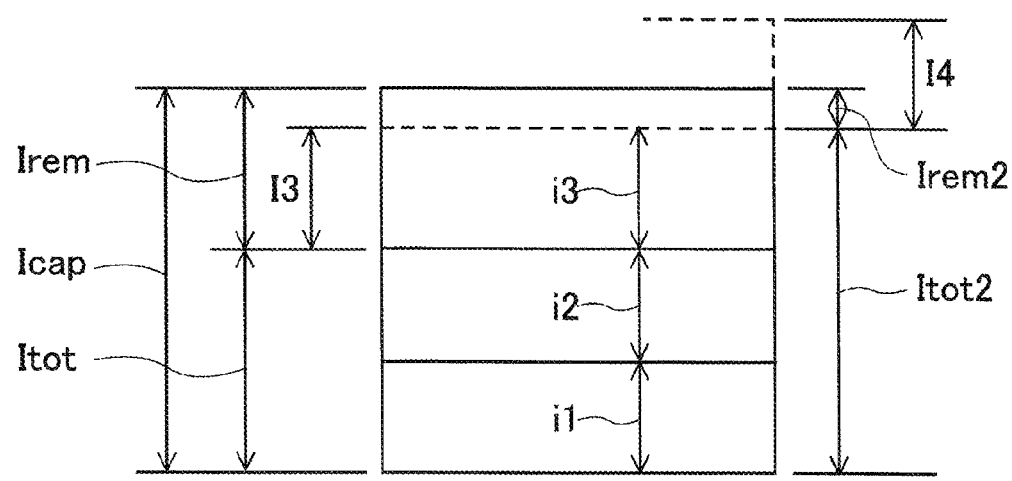
FIG. 5 is a diagram schematically illustrating a function of preventing an occurrence of an overcurrent state which is performed by an overcurrent protection section of the first embodiment.

Here, the function of preventing the occurrence of the overcurrent state which is performed by the overcurrent protection section 24 is described with a specific example. FIG. 5 is a diagram schematically illustrating the function of preventing the occurrence of the overcurrent state which is performed by the overcurrent protection section 24 of the first embodiment. In FIG. 5, the largest rectangle represents the output current capacity Icap of the power supply device 41 or 42. There is assumed a case where first to fifth tape feeders 10 are installed on the pallet member 1A the power switches 52, the first and second tape feeders 10 are in the operation state, and the third to fifth tape feeders 10 are in the stop state where the power switches 52 shut off.

In the total consumption current measuring step S3, an operation state consumption current i1 of the first tape feeder 10 and an operation state consumption current i2 of the second tape feeder 10 are measured. In addition, the consumption currents of the third to fifth tape feeders 10 are zero. Hence, the total consumption current Itot is obtained as a sum of the two operation state consumption currents i1 and i2. At this point, the total consumption current Itot is lower than the output current capacity ICap, and determination of that there is no overcurrent state is performed in step S4.

In the next step S5, when the request of the unloading operation is issued to the third tape feeder 10, in the surplus current calculation step S6, the surplus current Irem is calculated by subtracting the total consumption current Itot from the output current capacity Icap. At this point, the surplus current Irem is higher than the obtained first increment (operation state consumption current I3) of the third tape feeder 10, and the surplus is determined to be present. Hence, in step S8, the third tape feeder 10 starts the unloading operation and transitions to the operation state.

When the operation returns to the total consumption current measuring step S3, an operation state consumption current i3 (≈I3) of the third tape feeder is measured, and a new total consumption current Itot2 is obtained. At this point, the total consumption current Itot2 is still lower than the output current capacity Icap, and determination of that there is no overcurrent state is performed in step S4 again.

In step S5 again, when the request of the unloading operation is issued to the fourth tape feeder, in the surplus current calculation step S6 again, the surplus current calculating section calculates a surplus current Irem2 by subtracting the total consumption current Itot2 from the output current capacity Icap. At this point, the surplus current Irem2 is lower than the obtained first increment (operation state consumption current I4) of the fourth tape feeder, and determination of that there is no surplus is performed. Hence, in step S9, the fourth tape feeder maintains the stop state.

In the related art, a configuration of allowing the tape feeder 10 to perform the unloading operation in accordance with an Individual request is employed. Therefore, when multiple individual requests are issued, there is a latent concern that the overcurrent state will occur and a fuse 43 will be melted. In addition, in the related art, in a case where a collective request or multiple individual requests of the unloading operation are issued, a configuration of allowing only a certain number of (for example, two) tape feeders 10 to perform the unloading operation in order to avoid the overcurrent state is employed. However, since the consumption current varies depending on the types of tape feeders 10, the configuration is inefficient because surplus current is present in an actual state and the operation can be performed in a number of (for example, three or more) tape feeders exceeding the certain number.

By comparison to the related art, in the first embodiment, the maximum number of tape feeders 10 are allowed to perform the unloading operation in a range in which the surplus current is present. Hence, it is possible to efficiently perform the setup changing work and to end the setup changing work in a time shorter than that in the related art.

In an application of the first embodiment, the consumption current acquisition step S2 and steps S5 to S9 may be omitted, and only the second function of the overcurrent protection section 24 of rapidly canceling the overcurrent state may be used. Conversely, it is possible to omit steps S4 and S10 and to use only the first function of the overcurrent protection section 24 of preventing the occurrence of the overcurrent state.

(4. Aspect and Effects of Power Supply Control Device 2 of Component Supply Device 1 of First Embodiment)

The power supply control device 2 of the component supply device 1 according to the first embodiment is the power supply control device 2 that controls the consumption current that is supplied from the power supply device 41 or 42 to the installed tape feeders 10 in the component supply device 1 in which the multiple replaceable tape feeders 10 including the driving devices (the first feeding motor 131 and the second feeding motor 141), which supply the taped electronic component to the predetermined position, and the control device 17 that controls the driving devices are replaceably installed, and the power supply control device 2 includes the total consumption current measuring section 21 that obtains, based on the measurement, the total consumption current Itot by adding actual consumption currents which are supplied to the multiple tape feeders 10 installed in the component supply device 1; and the overcurrent protection section 24 that causes the specific tape feeder 10 of the multiple tape feeders 10, which is in the operation state where the driving devices operate, to transition to the stop state where the specific tape feeder is shut from the power supply device 41 or 42, in the case of the overcurrent state where the total consumption current Itot exceeds the output current capacity Icap of the power supply device 41 or 42.

The power supply control device 2 of the component supply device 1 according to the first embodiment causes the specific tape feeder 10 that is in the operation state to transition to the stop state, in the case of the overcurrent state where the total consumption current Itot obtained based on the measurement exceeds the output current capacity Icap of the power supply device 41 or 42. Therefore, the total consumption current Itot is reduced. Hence, even though the overcurrent state occurs during the setup changing world in which the multiple tape feeders 10 can operate, the overcurrent state is rapidly canceled, and thus the protecting function is improved. In this manner, there is a reduction in concern that the protective fuse 43 installed in the power supply device 41 or 42 will be melted and result in a hindrance to production.

Further, the power supply control device 2 of the component supply device 1 according to the first embodiment further includes: the consumption current acquisition section 22 that acquires, in advance based on the measured value or the design value, at least one of the first increment of the consumption current that is supplied when the multiple tape feeders 10 transition from the stop state to the operation state and a second increment of the consumption current that is supplied when the multiple tape feeders 10 transition from the standby state to the operation state; and the surplus current calculating section 23 that calculates surplus currents Irem and Irem2 by subtracting the total consumption currents Itot and Itot2 from the output current capacity Icap, in a case where there is no overcurrent state. In a case where the request of causing a tape feeder 10 (third tape feeder 10) that is in the stop state or the standby state to transition to the operation state is issued, the overcurrent protection section 24 allows the tape feeder 10 (third tape feeder 10) to transition to the operation state, when the first increment (operation state consumption current I3) or the second increment of the tape feeder, which has been acquired by the consumption current acquisition section 23, is equal to or lower than the surplus current Irem, and maintains the stop state of the tape feeder 10 (fourth tape feeder 10), when the first increment (operation-period consumption current I4) or the second increment of the tape feeder 10 (fourth tape feeder 10) exceeds the surplus current Irem2.

Accordingly, instead of the related art in which only a certain number of tape feeders 10 are allowed to perform the unloading operation, it is possible to allow the unloading operation to the maximum number of tape feeders 10 within the range in which the surplus current is present. Hence, it is possible to efficiently perform the setup changing work and to end the setup changing work in a time shorter than that in the related art. In addition, since the overcurrent protection section 24 prevents the overcurrent state from occurring, there is a more reduction in concern that the protective fuse 43 will be melted.

Further, the total consumption current measuring section 21 measures the individual actual consumption currents that are supplied to the multiple tape feeders 10 and obtains the total consumption current Itot by adding individual measured values. Accordingly, since the total consumption current Itot is obtained by measurement, the determination of the overcurrent state or the determination of whether or not the tape feeder 10 operates, by using the surplus currents Irem and Irem2 are performed with high accuracy.

Further, the total consumption current measuring section 21 measures the individual actual consumption currents that are supplied to the multiple tape feeders 10 and obtains the total consumption current Itot by adding individual measured values. The overcurrent protection section 24 causes a specific tape feeder 10 of the tape feeders 10 which are in the operation state to transition to the stop state, in the case of the overcurrent state. Accordingly, when the overcurrent state occurs, it is possible to separate the tape feeder 10, which is estimated to have an occurrence of a fault, from the power supply devices 41, 42 and to reduce damage due to the fault.

Further, the power supply device 41 or 42 and the tape feeder 10 are connected to each other with the branched power supply line 34 through which the consumption current is supplied and on which the power switch 52 that shuts off the consumption current is interposed. The overcurrent protection section 24 controls the tape feeder 10 such that the tape feeder 10 is in the stop state and the operation state through opening and closing control of the power switch 52. Accordingly, the shut-off operation of the power switch 52 enables the tape feeder 10 to rapidly and accurately transition from the operation state to the stop state.

Further, the tape feeder 10 has the first feeding motor 131 and the second feeding motor 141 that unwind the carrier tape, in which the electronic component is taped, from the supply reel. The operation of the driving device includes the unloading operation of discharging the carrier tape from the tape feeder 10 by reversely driving motors of the first feeding motor 131 and the second feeding motor 141. Accordingly, in a case where the unloading operations are simultaneously performed on the multiple tape feeders 10 during the setup changing work, the protection function against the overcurrent can increase.

Further, the power supply device is the internal-operating power supply device 41 in the electronic component mounting machine 9 in a case where the component supply device 1 is mounted on the electronic component mounting machine 9, and the power supply device is the external-setup-changing power supply device 42 in a case where the component supply device 1 is detached from the electronic component mounting machine 9. Accordingly, the effects described above are achieved in both of the internal setup changing work and the external setup changing work.

The power supply control method of the component supply device 1 according to the embodiment of the present disclosure is the power supply control method that controls the consumption current that is supplied from the power supply device 41 or 42 to the installed tape feeder 10 in the component supply device 1 in which the multiple tape feeders 10 including the driving devices (the first feeding motor 131 and the second feeding motor 141), which supply the taped electronic component to the predetermined position, and the control device 17 that controls the driving device are replaceably installed, and the power supply control method includes a total consumption current measuring step S3 of obtaining, based on measurement, the total consumption current Itot by adding the actual consumption currents which are supplied to the multiple tape feeders 10 installed in the component supply device 1; and an overcurrent protection step S10 of causing the specific tape feeder 10 of the multiple tape feeders 10, which is in the operation state where the driving device operates, to transition to the stop state where the specific tape feeder is shut from the power supply device 41 or 42, in a case of the overcurrent state where the total consumption current Itot exceeds the output current capacity Icap of the power supply device 41 or 42.

The present disclosure can be embodied as the power supply control method of the component supply device 1 of the embodiment, and the same effects as those of the power supply control device 2 of the component supply device 1 of the first embodiment described above are obtained.

(5. Power Supply Control Device 2A of Component Supply Device 1 of Second Embodiment)

Next, a power supply control device 2A of the component supply device 1 of the second embodiment will be described by focusing on a difference from the first embodiment. In the second embodiment, the configuration of the component supply device 1 is the same as that in the first embodiment, and means for obtaining the total consumption current Itot differs from that in the first embodiment. In addition, operation details of a total consumption current measuring section 21A and an overcurrent protection section 24A differ from those in the first embodiment.

Figure 6:
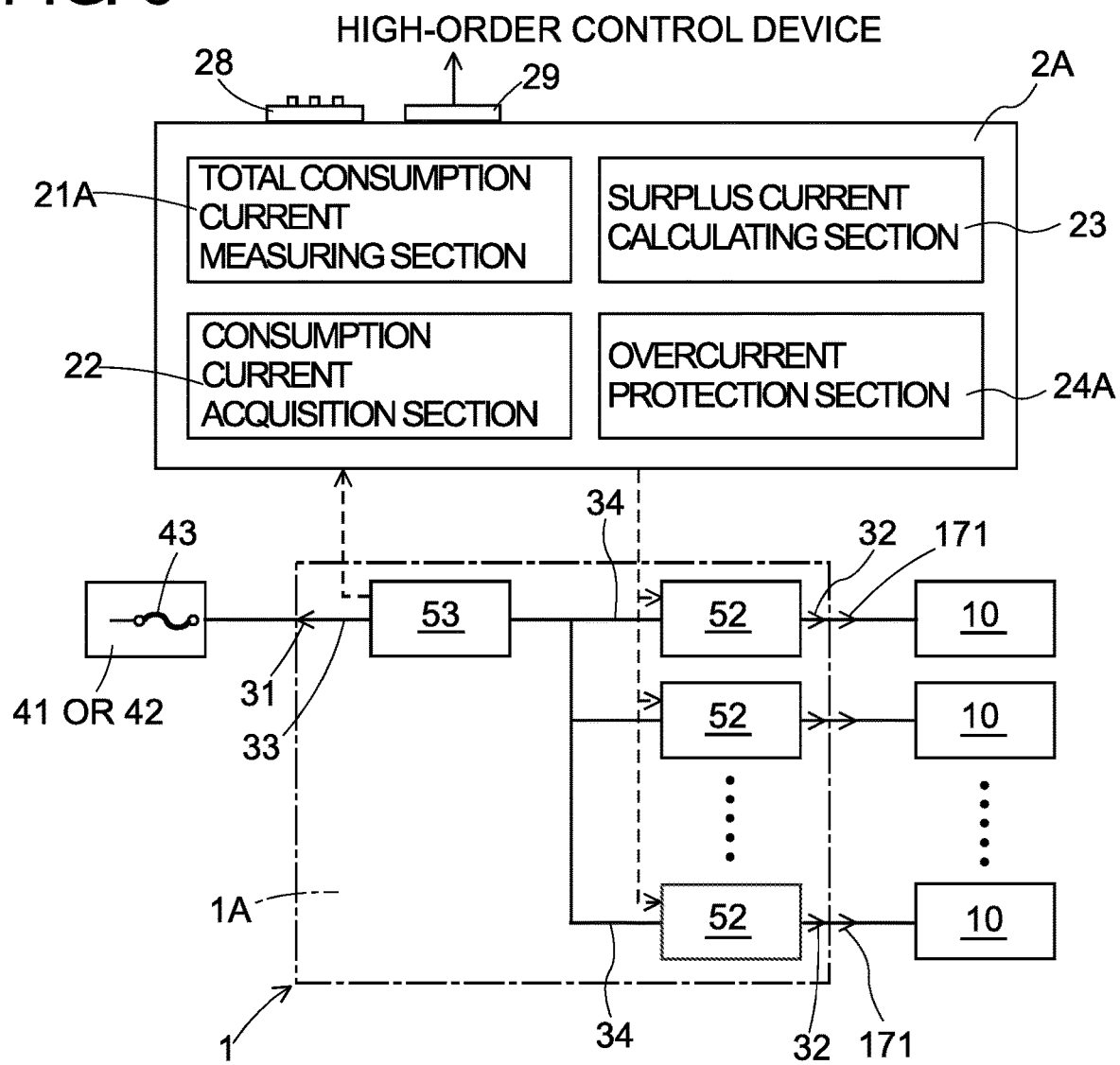
FIG. 6 is a block diagram illustrating a power supply control device of the component supply device of a second embodiment.

FIG. 6 is a block diagram illustrating the power supply control device 2A of the component supply device 1 of the second embodiment. As illustrated in the figure, instead of the individual-current measurement section 51 of the branched power supply lines 34, a collective current measurement section 53 is provided in the main power supply line 33. The collective current measurement section 53 directly measures the actual total consumption current Itot that is output from the power supply device 41 or 42. The power supply control device 2A acquires information of a measured value obtained by the collective current measurement section 53.

The power supply control device 2A of the component supply device 1 according to the second embodiment operates based on the operation flow of the first embodiment illustrated in FIG. 4, and a part of operation is different therefrom. Hereinafter, an operation different from that in the first embodiment will be described, and thus the description of the same operation will be omitted. In the total consumption current measuring step S3 in FIG. 4, the total consumption current measuring section 21A of the second embodiment receives and acquires information of a total consumption current from the collective current measurement section 53.

In addition, in step S10, the overcurrent protection section 24A of the second embodiment determines, in accordance with a preset priority, the tape feeder of the tape feeders 10 which are in the operation state such that the tape feeder 10 transitions to the stop state or the standby state. In the second embodiment, since there is no individual measured values of the consumption current, it is not possible to identify the tape feeder 10 that is estimated to have a fault, and thus the identification is performed in accordance with a priority.

Figure 7:
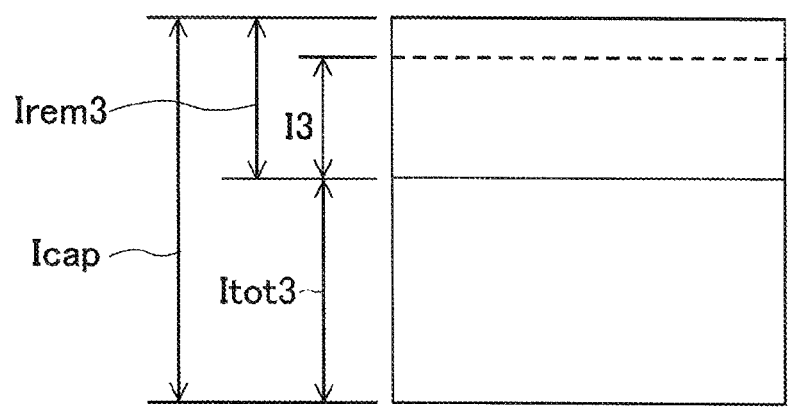
FIG. 7 is a diagram schematically illustrating a function of preventing an occurrence of an overcurrent state which is performed by an overcurrent protection section of the second embodiment.

Here, the function of preventing the occurrence of the overcurrent state which is performed by the overcurrent protection section 24A is described with a specific example. FIG. 7 is a diagram schematically illustrating the function of preventing the occurrence of the overcurrent state which is performed by the overcurrent protection section 24A of the second embodiment. In FIG. 7, a total consumption current Itot3 is directly measured in a case where the first tape feeder 10 and the second tape feeder 10 are in the operation state, and the third to fifth tape feeders 10 are in the stop state. Hereinafter, the calculation of a surplus current Irem3, comparison with the first increment (operation state consumption current I3) of the third tape feeder 10, and the like are the same as those in the first embodiment.

In the power supply control device 2 of the component supply device 1 according to the second embodiment, the total consumption current measuring section 21A directly measures the actual total consumption current Itot3 that is output from the power supply device 41 or 42. Accordingly, since the total consumption current Itot3 is obtained by the measurement, the determination of the overcurrent state or the determination of whether or not the tape feeder 10 operates, by using the surplus current Irem3 are performed with high accuracy. In addition, compared to the first embodiment, since the number of actual measurement points of the consumption current is small, it is possible to reduce costs.

(6. Power Supply Control Device 2B of Component Supply Device 1 of Third Embodiment)

Next, a power supply control device 2B of the component supply device 1 of the third embodiment will be described by focusing on a difference from the first embodiment. In the third embodiment, the configuration of the component supply device 1 is the same as that in the first embodiment, and means for causing the tape feeder 10 that is in the operation state to transition to the standby state differs from that in the first embodiment. In addition, operation details of an overcurrent protection section 24B differ from those in the first embodiment.

Figure 8:
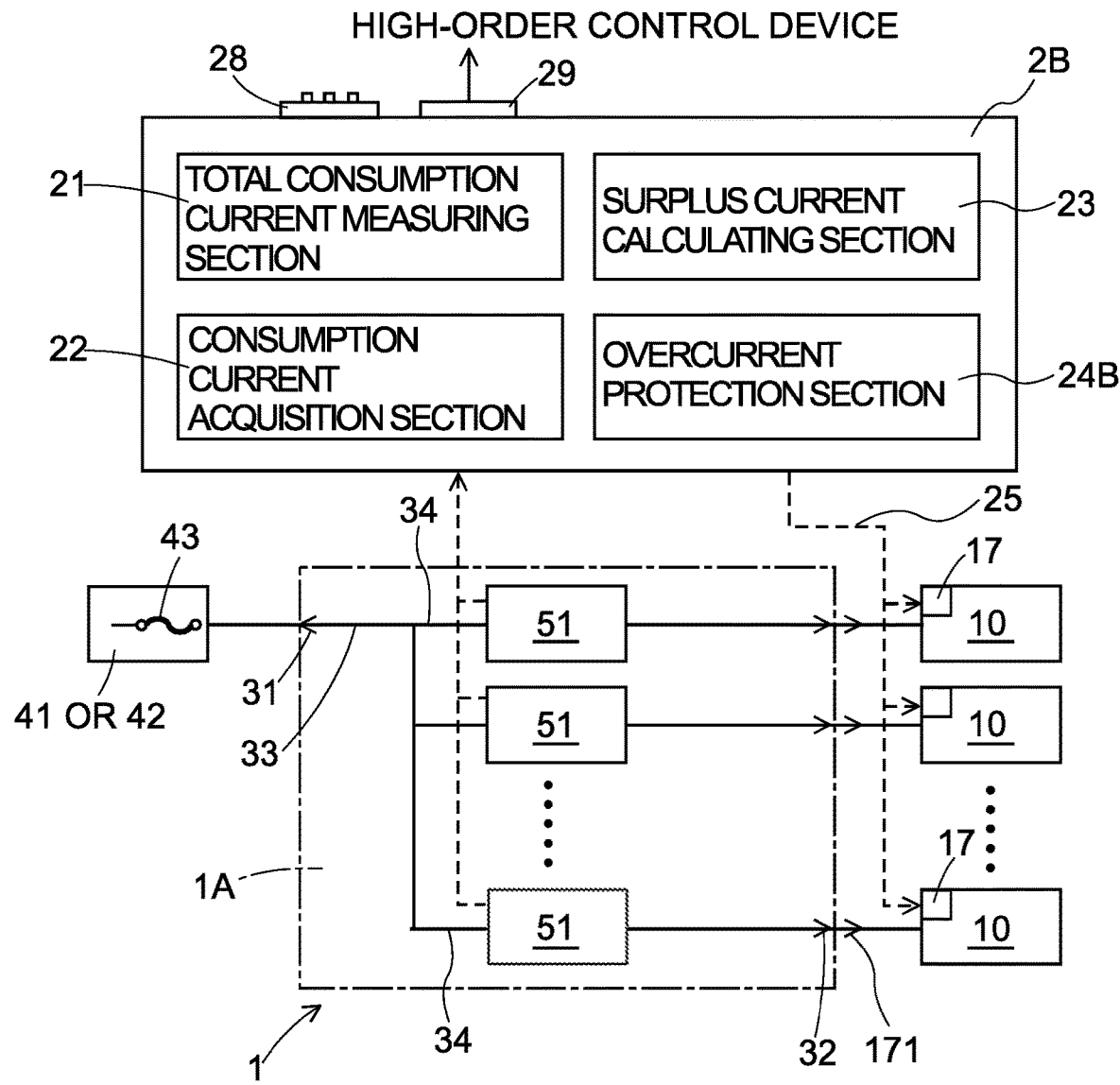
FIG. 8 is a block diagram illustrating a power supply control device of the component supply device of a third embodiment.

FIG. 8 is a block diagram illustrating the power supply control device 2B of the component supply device 1 of the third embodiment. As illustrated in the figure, the power switches 52 of the branched power supply lines 34 are not provided. Hence, when the power supply device 41 or 42 is connected to the pallet member 1A, the tape feeders 10 come into the standby state where the control device 17 operates. In addition, the overcurrent protection section 24B of the power supply control device 2B and the control devices 17 of the tape feeders 10 are connected to each other with respective control lines 25. In this manner, the overcurrent protection section 24B is capable of issuing an instruction of allowing and prohibiting the unloading operation to the control devices 17 through the control lines 25, that is, an instruction of allowing and prohibiting the operations of the first feeding motor 131 and the second feeding motor 141.

The power supply control device 2B of the component supply device 1 according to the third embodiment operates based on the operation flow of the first embodiment illustrated in FIG. 4, and a part of operation is different therefrom. Hereinafter, an operation different from that in the first embodiment will be described, and thus the description of the same operation will be omitted. In step S7 in FIG. 4, the overcurrent protection section 24B of the third embodiment compares the surplus current with the second increment of the tape feeder 10 to which the request of the unloading operation is issued. In addition, in step S10 in FIG. 4, the overcurrent protection section 24B of the third embodiment issues an instruction of prohibiting the unloading operation to the control device 37 of the specific tape feeder 10 that is in the unloading operation state. In this manner, the specific tape feeder 10 stops the unloading operation and transitions to the standby state.

Figure 9:
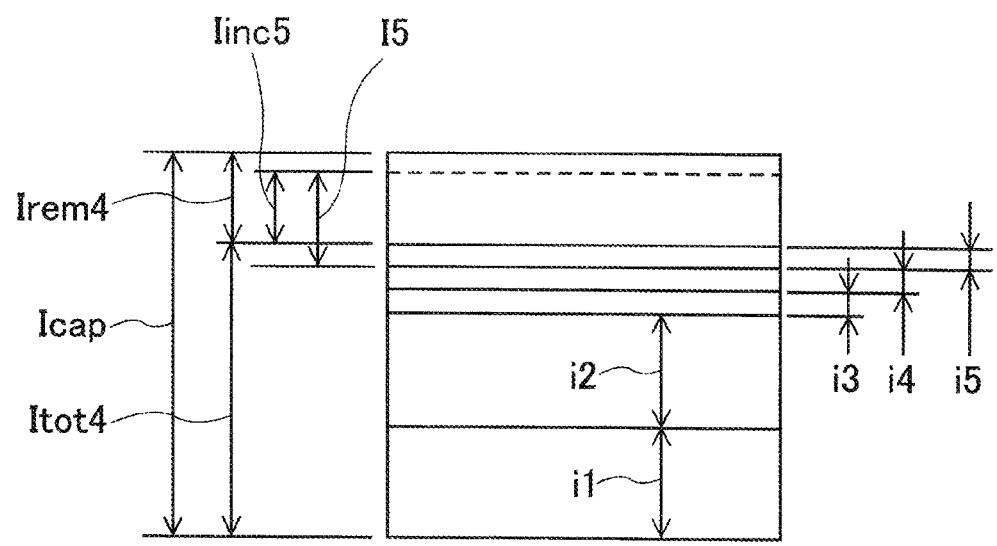
FIG. 9 is a diagram schematically illustrating a function of preventing an occurrence of an overcurrent state which is performed by an overcurrent protection section of the third embodiment.

Here, the function of preventing the occurrence of the overcurrent state which is performed by the overcurrent protection section 24B is described with a specific example. FIG. 9 is a diagram schematically illustrating the function of preventing the occurrence of the overcurrent state which is performed by the overcurrent protection section 24B of the third embodiment. There is assumed a case where the first tape feeder 10 and the second tape feeder 10 are in the operation state, and the third to fifth tape feeders 10 are in the standby state.

In the total consumption current measuring step S3 in FIG. 4, the operation state consumption currents i1 and i2 of the first and second tape feeders 10 and standby state consumption currents i3, i4, and i5 of the third, fourth, and fifth tape feeders 10 are measured. Normally, the operation state consumption currents i1 and i2 are higher than the standby state consumption currents i3, i4, and i5. In this manner, a total consumption current Itot4 is obtained as a sum of the five consumption currents i1 to i5. At this point, the total consumption current Itot4 is lower than the output current capacity ICap, and determination of that there is no overcurrent state is performed in step S4.

In the next step S5, when the request of the unloading operation is issued to the fifth tape feeder 10, in the surplus current calculation step S6, a surplus current Irem4 is calculated by subtracting the total consumption current Itot4 from the output current capacity Icap. Here, the overcurrent protection section 24B of the third embodiment may use the acquired second increment of the fifth tape feeder 10 or may use another method. In the other method, the overcurrent protection section 24B obtains a second increment Iinc5 by subtracting the measured standby state consumption current i5 from an operation state consumption current I5 of the fifth tape feeder 10.

In FIG. 9, the surplus current Irem4 is higher than the second increment Iinc5, and the surplus is determined to be present. Hence, in step S8, the fifth tape feeder 10 starts the unloading operation and transitions to the operation state. If the surplus current Irem4 is lower than the second increment Iinc5, in step S9, the overcurrent protection section 24B maintains the standby state of the fifth tape feeder 10.

In the power supply control device 2B of the component supply device 1 according to the third embodiment, the overcurrent protection section 24B and the tape feeder 10 are connected to each other with the control lines 25 through which an instruction is transmitted. The overcurrent protection section 24B controls the tape feeders 10 such that the tape feeders are in the standby state and the operation state by issuing instructions of allowing and prohibiting the operations of the driving devices (the first feeding motor 131 and the second feeding motor 141) to the control devices 17 through the control lines 25.

Accordingly, since the control devices 17 continue operating without the stop state, the tape feeders 10 has high reliability of control. In addition, there is no need to complicatedly repeat an initial process executed when the control device 17 starts up.

(7. Power Supply Control Device 2C of Component Supply Device 1 of Fourth Embodiment)

Next, a power supply control device 2C of the component supply device 1 of the fourth embodiment will be described by focusing on a difference from the first embodiment. In the fourth embodiment, the configuration of the component supply device 1 is the same as that in the first embodiment, and a configuration of the power supply line and means for causing the tape feeder 10 that is in the operation state to transition to the standby state differ from that in the first embodiment. In addition, operation details of an overcurrent protection section 24C differ from those in the first embodiment.

FIG. 10 is a block diagram illustrating the power supply control device 2C of the component supply device 1 of the fourth embodiment. As illustrated in the figure, the branched power supply line 34 further branches into a drive power supply line 35 and a control power supply line 36 on a downstream side of the individual-current measurement section 51. The drive power supply line 35 is a line through which the drive current that is consumed by the first feeding motor 131 and the second feeding motor 141 is supplied and on which a drive power switch 54 is interposed. On the other hand, the control power supply line 36 is a line through which the control current that is consumed by the control device 17 is supplied.

The drive power supply line 35 and the control power supply line 36 are connected to the connector 171 of the tape feeder 10. Hence, when the power supply device 41 or 42 is connected to the pallet member 1A, the tape feeders 10 come into the standby state where the control device 17 operates. In addition, under the opening and closing control performed by the power supply control device 2, the shut-off state and the conduction state of the drive power switches 54 are switched and the drive power switch performs an opening and closing operation of only a drive current.

The power supply control device 2C of the component supply device 1 according to the fourth embodiment also operates based on the operation flow of the first embodiment illustrated in FIG. 4, and a part of operation is different therefrom. Hereinafter, an operation different from that in the first embodiment will be described, and thus the description of the same operation will be omitted. In step S10 in FIG. 4, the overcurrent protection section 24C of the fourth embodiment causes the specific tape feeder 10, which is in the unloading operation state, to the standby state by causing the drive power switch 54 to be in the shut-off state. The function of preventing the occurrence of the overcurrent state which is performed by the overcurrent protection section 24C is the same as that in the third embodiment illustrated in FIG. 9, and thus the detailed description is omitted.

In the power supply control device 2C of the component supply device 1 according to the fourth embodiment, the power supply device 41 or 42 and the tape feeder 10 are connected to each other with the drive power supply line 35, through which a drive current is supplied to be consumed by the driving devices (the first feeding motor 131 and the second feeding motor 141) and on which the drive power switch 54 that shuts off the drive current is interposed, and the control power supply line 36 through which the control current is supplied to be consumed by the control device 17. The overcurrent protection section 24C controls the tape feeder 10 such that the tape feeder is in the standby state and the operation state through the opening and closing control of the drive power switch 54.

Accordingly, since the control devices 17 continue operating without the stop state, the tape feeders 10 has high reliability of control. In addition, there is no need to complicatedly repeat an initial process executed when the control device 17 starts up.

(8. Application and Modification of Embodiments)

The work is not limited to the setup changing work, and the present disclosure is also effective in a case where the unloading operation or a loading operation is performed on the tape feeder 10 during the operation of the electronic component mounting machine 9. In addition, in the embodiments, the control devices 17 of the tape feeders 10 store information on the operation state consumption current and the standby state operation current of the tape feeder 10, and the consumption current acquisition section 22 may acquire information on the currents from the control devices 17. Further, the present disclosure can also be realized by a configuration in which the power supply device 41, 42 do not include the protective fuse 43 or a configuration in which three or more feeding motors 131 and 141 of the tape feeder 10 are provided. The present disclosure can be applied or modified in various manners other than the manners described above.

REFERENCE SIGNS LIST

1: component supply device, 10: tape feeder, 11: main body section, 13: front tape feeding mechanism, 131: first feeding motor, 14: rear tape feeding mechanism, 141: second feeding motor, 17: control device, 1A: pallet member, 2, 2A to 2C: power supply control device, 21, 21A: total consumption current measuring section, 22: consumption current acquisition section, 23: surplus current calculating section, 24, 24A to 24C: overcurrent protection section, 25: control line, 33: main power supply line, 34: branched power supply line, 35: drive power supply line, 36: control power supply line, 41: internal-operating power supply device, 42: external-setup-changing power supply device, 51: individual-current measurement section, 52: power switch, 53: collective current measurement section, 54: drive power switch, 9: electronic component mounting machine, 92: board conveyance device, 94: component supply device, 95: component camera, 96: control device, Icap: output current capacity, Itot, Itot2 to Itot4: total consumption current, Irem, Irem2 to Irem4: surplus current, Iinc5: second increment

The invention claimed is:

1. A power supply control method of a component supply device, the component supply device including a plurality of tape feeders each including a driving device which supplies a taped electronic component to a predetermined position and including a control device that controls the driving device, the power supply control method controlling a consumption current that is supplied from a power supply device to the installed tape feeders, the power supply control method comprising:
   acquiring a stored value of an operation state consumption current and a standby state operation current for each of the plurality of tape feeders
   a determining a total consumption current by adding each of the operation state consumption currents of the plurality of tape feeders installed in the component supply device; and
   controlling a specific tape feeder of the plurality of tape feeders, which is in an operation state where the driving device operates, to transition to a stop state where the specific tape feeder is shut off from the power supply device or to a standby state where the operation of the driving device is stopped, when the total consumption current exceeds an output current capacity of the power supply device.

2. A power supply control device of a component supply device, the component supply device including a plurality of tape feeders each including a driving device which supplies a taped electronic component to a predetermined position and including a control device that controls the driving device, the power supply control device controlling a consumption current that is supplied from a power supply device to the installed tape feeders, the power supply control device comprising:
   a processor configured to
      acquire a stored value of an operation state consumption current and a standby state operation current for each of the plurality of tape feeders;
      determine a total consumption current by adding each of the operation state consumption currents of the plurality of tape feeders installed in the component supply device; and
      control a first tape feeder of the plurality of tape feeders, which is in an operation state where the driving device operates, to transition to a stop state where the first tape feeder is shut off from the power supply device or to a standby state where the operation of the driving device is stopped, when the total consumption current exceeds an output current capacity of the power supply device.

3. The power supply control device of a component supply device according to claim 2, wherein
   the operation state consumption current includes at least one of a first operation state consumption current that is supplied when the respective plurality of tape feeders transition from the stop state to the operation state and a second operation state consumption current that is supplied when the respective plurality of tape feeders transition from the standby state to the operation state,
   the processor is configured to calculate a surplus current by subtracting the total consumption current from the output current capacity, and
   the processor is configured to control a second tape feeder of the plurality of tape feeders that is in the stop state or the standby state to:
      transition to the operation state when the first operation state consumption current or the second operation state consumption current of the second tape feeder is equal to or lower than the surplus current, and
      maintain the stop state or the standby state of the second tape feeder when the first operation state consumption current or the second operation state consumption current of the tape feeder exceeds the surplus current.

4. The power supply control device of a component supply device according to claim 2, wherein
   the processor is configured to measure individual actual consumption currents that are supplied to the plurality of tape feeders and to determine the total consumption current by adding the individual actual consumption currents.

5. The power supply control device of a component supply device according to claim 2, wherein
   the processor determines the total consumption current by directly measuring an output from the power supply device.

6. The power supply control device of a component supply device according to claim 2, wherein
   the processor is configured to measure individual actual consumption currents that are supplied to the plurality of tape feeders and to determine the total consumption current by adding the individual actual consumption currents, and
   the processor causes the first tape feeder of the plurality of tape feeders which are in the operation state to transition to the stop state or the standby state in a case of the overcurrent state.

7. The power supply control device of a component supply device according to claim 2, wherein
the power supply device and the first tape feeder are connected to each other with a power supply line through which the consumption current is supplied and on which a power switch that shuts off the consumption current is interposed, and
wherein the processor controls the first tape feeder such that the first tape feeder is in the stop state or the operation state through opening and closing control of the power switch.

8. The power supply control device of a component supply device according to claim 2, wherein
the processor and the first tape feeder are connected to each other with a control line through which an instruction is transmitted, and
the processor controls the first tape feeder such that the first tape feeder is in the standby state and the operation state by issuing an instruction of allowing and prohibiting the operation of the driving device to the control device through the control line.

9. The power supply control device of a component supply device according to claim 2, wherein
the power supply device and the first tape feeder are connected to each other with a drive power supply line, through which a drive current is supplied to be consumed by the driving device and on which a drive power switch that shuts off the drive current is interposed, and a control power supply line, through which a control current is supplied to be consumed by the control device, and
the processor controls the first tape feeder such that the first tape feeder is in the standby state and or the operation state through opening and closing control of the drive power switch.

10. The power supply control device of a component supply device according to claim 1, wherein
the first tape feeder has a feeding motor that unwinds a carrier tape, in which the electronic component is taped, from a supply reel, and
the operation of the driving device includes an unloading operation of discharging the carrier tape from the first tape feeder by reversely driving the feeding motor.

11. The power supply control device of a component supply device according to claim 2, wherein
the power supply device is an internal-operating power supply device in an electronic component mounting machine in a case where the component supply device is mounted on the electronic component mounting machine, and the power supply device is an external-setup-changing power supply device in a case where the component supply device is detached from the electronic component mounting machine.

* * * * *